United States Patent [19]

Chamberlin et al.

[11] 4,228,570
[45] Oct. 21, 1980

[54] ELECTRODING PREPARATION APPARATUS

[75] Inventors: Rhodes R. Chamberlin; Herbert L. Bigham, both of El Paso, Tex.

[73] Assignee: Photon Power, Inc., El Paso, Tex.

[21] Appl. No.: 84,571

[22] Filed: Oct. 15, 1979

Related U.S. Application Data

[63] Continuation of Ser. No. 847,784, Nov. 2, 1977, abandoned.

[51] Int. Cl.³ .................. B23P 23/04; B23P 25/00
[52] U.S. Cl. ............................... 29/33 R; 29/583; 118/37; 118/76; 219/68
[58] Field of Search .............. 29/33 R, 33 B, 565, 29/566, 580, 583; 118/76, 37, 408; 219/68, 69 R, 121 R; 83/875, 917, 356.3, 679

[56] References Cited

U.S. PATENT DOCUMENTS

| 2,248,057 | 7/1941 | Bond | 219/68 X |
| 2,680,184 | 6/1954 | Cox | 219/68 |
| 2,744,451 | 5/1956 | Lee | 83/875 X |
| 3,438,354 | 4/1969 | Luescher | 118/76 |
| 3,937,915 | 2/1976 | Matsuo et al. | 219/68 |

FOREIGN PATENT DOCUMENTS 217860  2/1968  U.S.S.R. .................. 118/35

Primary Examiner—Horace M. Culver
Attorney, Agent, or Firm—Bard & Groves

[57] ABSTRACT

An apparatus is provided for forming a large area photovoltaic cell into a plurality of photovoltaic cells on a common substrate and preparing the individual cells for an overlying layer of conductive material. A tool bit is urged against the polycrystalline materials forming the heterojunction to remove a preselected pattern and expose a layer of conductive material, tin oxide, on a supporting glass substrate. Tool bit pressure causes fracturing of the crystals to produce defined edges along the tool bit furrow. An electrical arc is produced to vaporize a portion of the exposed tin oxide to electrically isolate the individual photovoltaic cells. Applicator pens coat the edges of the polycrystalline material with preselected insulating films. Finally, a buffer wheel abrades a preselected metal onto the remaining exposed surface of the tin oxide to obtain an improved metallurgical and/or electrical contact between the tin oxide and the subsequent conductor layer. Indexing mechanisms are provided for positioning the large area cell relative to the various tools for providing a plurality of preparatory passes along the large area cell.

8 Claims, 5 Drawing Figures

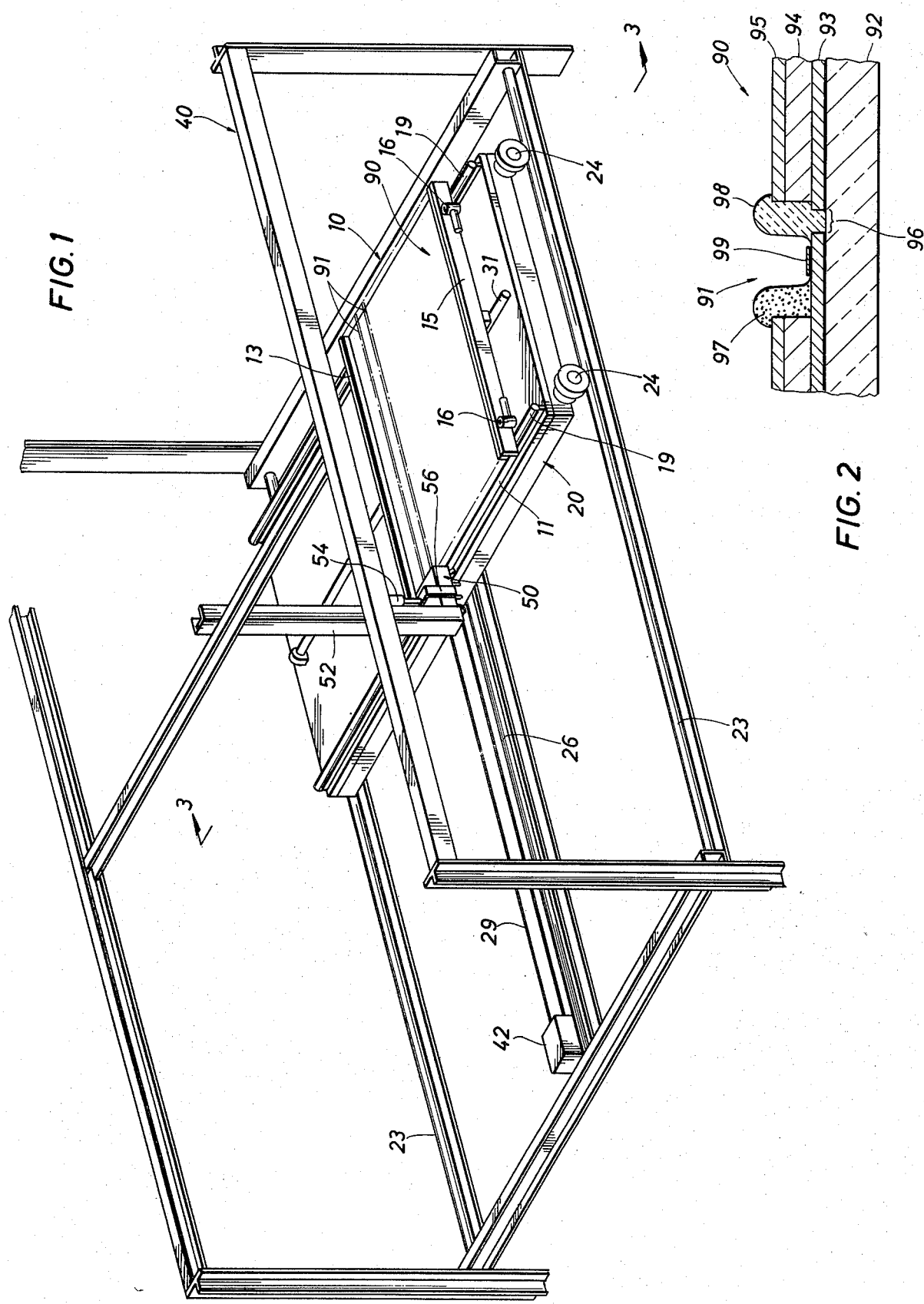

ELECTRODING PREPARATION APPARATUS

RELATED PATENT APPLICATIONS

This is a continuation of a copending U.S. patent application Ser. No. 847,784, filed Nov. 2, 1977 now abandoned.

FIELD OF THE INVENTION

This invention relates generally to apparatus for fabricating large area photovoltaic cells, and more particularly, to apparatus for forming a photovoltaic panel into a plurality of cells and preparing the panel for a subsequent conductive coating to form an array of series connected solar cells.

BACKGROUND OF THE INVENTION

A completed photovoltaic cell which is well known in the art includes a layer of cadmium sulfide (CdS) disposed on a suitable substrate, and a second material which forms a heterojunction or "barrier layer", in cooperation with the CdS. The material typically used to form a heterojunction with CdS is cuprous sulfide, $Cu_xS$, x being less than 2 where non-stoichometric cuprous sulfide is formed over the CdS. The technology to mass produce photovoltaic cells which incorporate the $Cds$—$Cu_xS$ heterojunction is rapidly developing and is not, per se, a subject of the instant invention.

To provide for large scale terrestrial application, the individual photovoltaic cells must be formed into an interconnected array covering large areas. Typically, CdS-$Cu_xS$ heterojunctions produce a voltage of 0.4–0.5 volts. If a higher output voltage is desired in order to transmit or use directly the output power from the photovoltaic cell array, the individual cells may be connected in a series arrangement to produce output voltages of 12-24 volts, i.e., output voltages which are equivalent to voltages produced by present day storage batteries.

Early attempts to provide photovoltaic arrays generally consisted of taking individual photovoltaic cells, adhering those cells to a common substrate, and then interconnecting the photovoltaic cells with wire conductors to complete the array. Such photovoltaic arrays were custom fabricated and were expensive to produce. The requirement to provide for a large number of conductor wires further reduced the availability of surface area for active photovoltaic power generation and thereby reduced the overall efficiency of the photovoltaic array.

The availability of polycrystalline CdS as a component in a photovoltaic cell has greatly increased the capability of forming a series connected array of such cells. U.S. Pat. Nos. 3,483,038, to Hui et al, and 3,571,905 and 3,713,893 to Shirland are typical of recent prior art attempts to provide a large area solar cell array. Both the Hui and Shirland patents teach a process for forming the solar cell array wherein the individual cells are formed as discrete units on the substrate. A mask is placed over the area which is not to receive the deposited material, the selected material is vacuum evaporated and the mask is then removed to complete the formation of that particular layer. A new mask is required for each patterned layer which is to be deposited and an alternating sequence of mask application and layer deposition occurs until the completed photovoltaic array has been formed. It may be appreciated that this method is time consuming and is not well adapted to mass production of large scale panel arrays where the cells are series connected.

Yet another technique for producing photovoltaic cells with polycrystalline CdS is to spray suitable solutions onto a substrate where the solution reacts to form a film of the desired material. U.S. Pat. Nos. 3,880,633 and 3,902,920 to Jordan et al, disclose suitable techniques for forming large area photovoltaic cells by the spray method. A glass substrate is moved through a series of spray booths to form layered films of tin oxide, cadmium sulfide, and perhaps cuprous sulfide. It is a feature of these spray processes that each film is formed at a temperature lower than that at which the preceding film is formed. Accordingly, it would be desirable to form the large photovoltaic panel into some number of smaller cells, to be connected in series for increased voltage outputs, only after all of the layers have been formed. Such a technique would minimize the thermal cycling of the glass and the time and energy required to produce the photovoltaic panel.

The disadvantages of the prior art are overcome by the present invention, however, and improved apparatus are provided for forming an array of photovoltaic cells connected in series including a machine for separating a lrge photovoltaic panel into a plurality of photovoltaic cells on a common substrate.

SUMMARY OF THE INVENTION

Apparatus is provided for separating a large area photovoltaic panel into a plurality of smaller photovoltaic cells. In accordance with the teachings of the present invention, apparatus is provided to remove an overlying semiconductor material to expose a preselected pattern of an electrically conductive material on a transparent substrate and form a plurality of smaller photovoltaic area on the substrate. A vaporizing tool is provided to remove a portion of the exposed electrically conductive film to electrically isolate the smaller photovoltaic areas, forming individual photovoltaic cells. Insulation applicator pens apply strips of insulation to exposed semiconductor edges and material may be abraded onto the surface of the electrically conductive material, if needed, to improve adhesion and/or electrical contact of an overlying electrical conductor.

It is a primary feature of the present invention to produce a series connected photovoltaic array by forming the various films which form the photovoltaic cells over the entire substrate and thereafter removing selected portions of the films to form the array.

It is another feature of the present invention that an electrically conducting film on the substrate and an overlying CdS layer can be formed by means of a spray technique covering the entire panel and portions of the films thereafter removed to form individual photovoltaic cells.

It is a feature of the present invention to provide a machine for separating a large area photovoltaic cell into a plurality of smaller photovoltaic cells on a common substrate.

It is another feature of the present invention to remove portions of the layered films which form the large area photovoltaic cell by cutting through the films.

It is a feature of the present invention to provide apparatus for subdividing a large area photovoltaic panel composed of at least one layer of semiconductor material disposed on a transparent electrically conductive film on a rigid substrate where a first cutting means traverses the substrate to remove a portion of the semiconductor material and expose a portion of the conductive film and a second cutting means moves traversely across the substrate to remove a strip of the exposed portion of the conductive film.

Other and further objects, advantages and features will become apparent from the following detailed description, wherein reference is made to the figures in the accompanying drawings.

IN THE DRAWINGS

FIG. 1 is an isometric view of one embodiment of the electroding machine according to the present invention.

FIG. 2 is a cross-sectional view showing the separation between photovoltaic cells and films formed by operation of the electroding machine.

DETAILED DESCRIPTION

Figure 3:
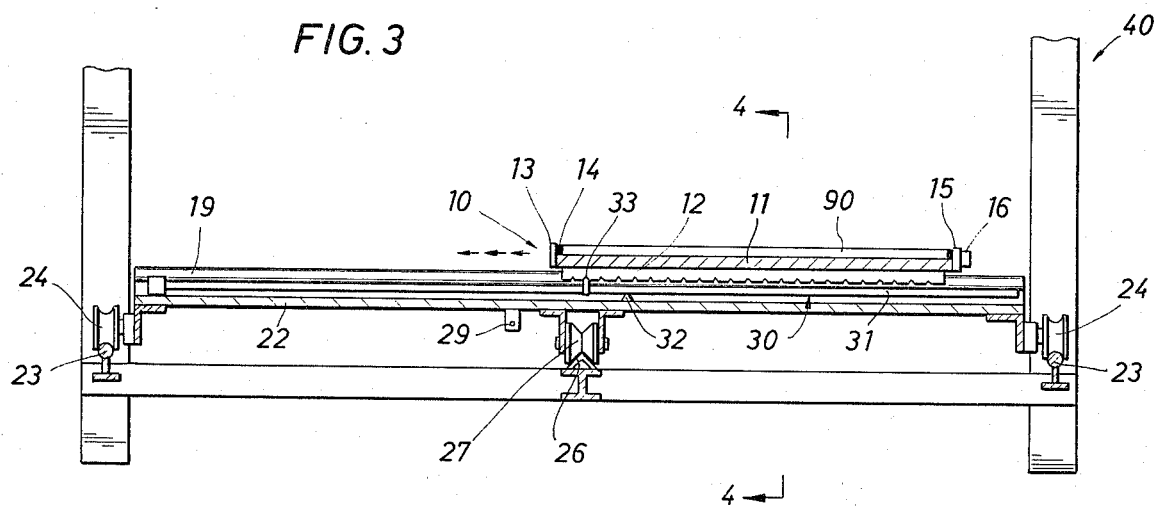
FIG. 3 is a cross-sectional view taken across Section 3—3 shown in FIG. 1.

Referring first to FIG. 1, there may be seen a perspective view of an apparatus depicting one embodiment of the present invention for forming a photovoltaic panel 90 into a plurality of electrically isolated photovoltaic cells and preparing each of the photovoltaic cells for receiving an overlying conducting layer which interconnects the individual photovoltaic cells into a series photovoltaic array. Photovoltaic panel 90 is a large area panel having a rigid substrate, which may conveniently be glass, a conducting layer on that substrate, which may conveniently be a non-stoichiometric tin oxide, and one or more layers of semi-conductor materials, such as cadmium sulfide and a nonstoichiometric cuprous sulfide, where each of the layers is formed over the entire substrate surface.

Photovoltaic panel 90 is placed on substrate indexing plate 10 with one edge bearing against edge strip 13 of base plate 11. There may be a separate material disposed between the edge of panel 90 and strip 13 in order to prevent damage to the edge of photovoltaic panel 90. Clamping strip 15, which is resiliently mounted adjacent base plate 11 is urged against an opposing edge of photovoltaic panel 90 by clamping means 16 to secure photovoltaic panel 90 upon indexing plate 10.

Indexing plate 10 is mounted on traversing carriage 20 and moves along indexing support tracks 19. Indexing plate 10 is movble to a plurality of predetermined positions along traversing carriage 20, and indexing means 31 is used to precisely position indexing plate 10 at each predetermined location.

After photovoltaic panel 90 has been indexed to the desired location along transversing carriage 20, drive means 42 is actuated to move traversing carriage 20 along support rails 23, which are conveniently mounted on support frame 40. Traversing carriage 20 is driven by the movement of drive wire 29 in the desired direction and moves substantially from one end of frame 40 to the other end of frame 40. Drive wire 29 may be conveniently wound about a capstan (not shown) having spiral grooves in order to minimize any slippage. The capstan (not shown) is driven by a reversible electric motor (not shown). The electric motor (not shown) is controlled by a plurality of switches (not shown) which may conveniently be an operator controlled switch for activating the drive motor (not shown) and a plurality of limit switches (not shown) located at the travel extremes desired for traversing carriage 20 for deactivating the drive motor (not shown). Alignment of traversing carriage 20 is maintained by "V"-rail 26 as traversing carriage 20 moves within frame 40.

Referring still to FIG. 1, there may be seen tool head 50 which is vertically movable within support channel 52 and actuated vertically by operating cylinder 54 which is connected to support channel 52. When traversing carriage 20 moves beneath tool head 50 in the cutting direction, tool head 50 is lowered into operating position, as hereinafter explained. After the cutting pass has been completed, tool head 50 is raised by operating cylinder 54 and traversing carriage 20 is returned beneath the raised tool head 50 into position for another cutting pass. In FIG. 1, there is depicted only one tool head 50. It will be apparent, however, that a plurality of tool heads could be provided to minimize the number of times the traversing carriage 20 must be actuated to complete the separation of photovoltaic panel 90 into a plurality of photovoltaic cells. Such additional tool heads could be arranged in a variety of ways, e.g., one beside another or staggered along the path of traversing carriage 20, such arrangement being a matter of choice and determined by the size of tool head 50 and support frame 40. In the extreme, sufficient tool heads are provided for making all of the cuts in one traverse of carriage 20.

Referring now to FIG. 2, there may be seen a cross-sectional view through photovoltaic panel 90 illustrating the configuration of the separated photovoltaic cells produced by one pass of photovoltaic panel 90 beneath tool head 50. In particular, a portion of cadmium sulfide layer 94 and cuprous sulfide layer 95 have been removed to provide a first groove 91 and expose the surface of the tin oxide conducting layer within groove 91. A portion of the exposed tin oxide layer 93 is removed, forming the base electrode gap 96 and serving to electrically isolate the individual photovoltaic cells formed by the cadmium sulfide 94 and cuprous sulfide 95 layers overlying each of the isolated tin oxide areas 93.

The exposed edges of semi-conductor layers 95 and 94 are coated with insulating materials 97 and 98 and isolation gap 96 may be filled with an insulating material 98. Insulating films 97 and 98 may be formed from a variety of materials to which the semi-conductor layers 94 and 95 do not react to reduce cell performance. Materials which have been successfully used include a photo-resist marketed under the trademark KMER by Kodak, polyvinyl chloride films, acrylic paint and cellulose film formers. The insulating materials are generally applied as a high solid content slurry with just enough solvent to enable the slurry to flow through the pen. Insulating materials 97 and 98 are selected based on the particular method chosen to actually separate the overlying conductor layers and form the completed series interconnection. A variety of techniques and the corresponding insulating film requirements are contained in U.S. patent application Ser. No. 831,544 filed Sept. 8, 1977, and which disclosure is incorporated herein by reference.

Finally, FIG. 2 depicts "adhesive strip" 99 which has been applied to the remaining exposed area of the tin oxide layer 93. It has been found that certain overlying conductor materials do not make a low resistance contact and/or metallurgical bond with the tin oxide when deposited directly on the tin oxide. Thus, an adhesive strip 99 may be provided for the purpose of insuring better electrical contact and/or metallurgical bond between the subsequent conducting layers and the underlying tin oxide layer 93. Adhesive strip 99 may be brass, zinc, indium, or some other metal, the selected material being a function of the material forming the overlying conductor. In one embodiment, a rotating wheel contacts the surface of tin oxide layer 93 and a small amount the desired material is abraded onto the surface.

It is obviously desirable that the width of groove 91 be as small as possible in order to minimize the amount of photovoltaically active materials removed from photovoltaic panel 90. Generally, each of the individual photovoltaic cells consists of a strip of semi-conductor materials extending the entire width of substrate panel 92, each strip having a width in the order of ten millimeters. It has been found that a groove 91 width of about one millimeter is required to accommodate insulation films 97 and 98 and adhesive strip 99. Isolation gap 96 has a width of only about 0.1 millimeter. Thus, approximately ten percent (10%) of the surface area of photovoltaic panel 90 may be required to form the electrical interconnections to produce the series connected solar cell array.

Referring now to FIG. 3, there may be seen a cross-sectional view taken along view 3—3 as shown in FIG. 1. Photovoltaic panel 90 is resting on base plate 11 with one edge against resilient member 14 and urged against the edge strip 13. Resilient member 14 is interposed to minimize damage to substrate materials, some of which are fragile and may be mounted on clamping strip 15 rather than edge strip 13, if desired, to provide a rigid clamp edge for reproducible positioning. Photovoltaic panel 90 is urged against strip 13 by a clamping strip 15. Clamping strip 15 may be resiliently mounted adjacent base plate 11 with sufficient movement to accommodate slight variations in the size of photovoltaic panel 90. A clamp means 16 is provided for urging clamping strip 15 against photovoltaic panel 90 and thereby secure photovoltaic panel 90 on base plate 11. Clamp means 16 may be conveniently provided by an eccentric cam rotatably mounted on base plate 11 and which urges clamping strip 15 toward photovoltaic panel 90 as the eccentric cam is rotated about its axis.

A variety of clamping means are available for securing photovoltaic panel 90 on base plate 11 and only a preferred embodiment is hereinabove discussed. The requirements for any such clamping mechanism include maintaining alignment of photovoltaic panel 90 within the clamping mechanism as clamping force is applied and providing sufficient clamping force to resist movement of photovoltaic panel 90 as the assembly is moved beneath the various cutting mechanisms but not enough force to damage photovoltaic panel 90. For example, another acceptable clamp might be formed from one or more threaded members engaging strips 13 and 15 for moving strips 13 and 15 with respect to one another and engaging a photovoltaic panel 90 placed therebetween.

After photovoltaic panel 90 has been clamped to base plate 11, the entire substrate indexing plate 10 is sequentially indexed to a plurality of predetermined locations along traversing carriage 20. At each such location carriage 20 is traversed beneath cutting head 50 (see FIG. 1) within frame 40 to form one or more photovoltaic cell separations. An indexing means 30 must be provided to precisely locate photovoltaic panel 90 beneath the cutting head to make each cut. In a preferred embodiment, an indexing strip 12 is located beneath base plate 11 and may conveniently take the form of a notched bar or strip. Each notch may be "V"-shaped to receive a correspondingly shaped index pin 33 mounted on index lever 31. Index lever 31 pivots about fulcrum 32 and extends beyond the edge of base plate 11 for convenient access. Index lever 31 is pulled upwardly to release index pin 33 from indexing means 12 and base plate 11 is moved to position the next index notch above index pin 33 and the lever released, whereby index pin 33 is pivoted about fulcrum 32 to engage the desired index notch in indexing means 12. The "V"-shaped engagements insure a high degree of accuracy and repeatability.

There are many mechanisms available for indexing base plate 11 to a plurality of predetermined positions and only a preferred embodiment is shown in FIG. 3. The primary requirement for any such indexing mechanism is to precisely locate photovoltaic panel 90 in order to insure uniform width of the photovoltaic strips produced on photovoltaic panel 90. An acceptable alternate mechanism, not illustrated, might utilize a lead screw engaging a traveling nut connected to base plate 11 whereby the base plate 11 would be positioned in response to rotation of the lead screw. The lead screw could then be rotated either by hand or by a step motor to produce precise incremental travel. It is within the scope of the present invention to cover any indexing system which obtains the required accuracy, whether manually or mechanically driven or whether manually or automatically actuated.

Referring again to FIG. 3, there is shown the mechanism for supporting and aligning traversing carriage 20 during traverse of carriage base 22 along and through frame 40. Carriage base 22 is supported by wheels 24 which are rotatably mounted on carriage base 22. Support wheels 24 ride on support rails 23 which extend the total distance along which the carriage 20 is to traverse. The purpose of support wheels 24 and support rails 23 are to carry the weight of photovoltaic panel 90, indexing plate 10 and traversing carriage 20.

Carriage base 22 must maintain a precise alignment while traversing the tool head in order to insure that the grooves 91 (see FIG. 1) remain parallel. This alignment is obtained by means of a "V"-shaped roller 27 engaging an inverted "V"-shaped track 26 mounted on frame 40. Guide track 26 is precisely positioned in fabricating support frame 40. The mating "V"-shapes minimize any lateral movement of carriage base 20 during traverse of carriage base 22 along support rails 23. Thus, each groove 91 will be formed in a parallel relationship with each adjacent groove.

Figure 4:
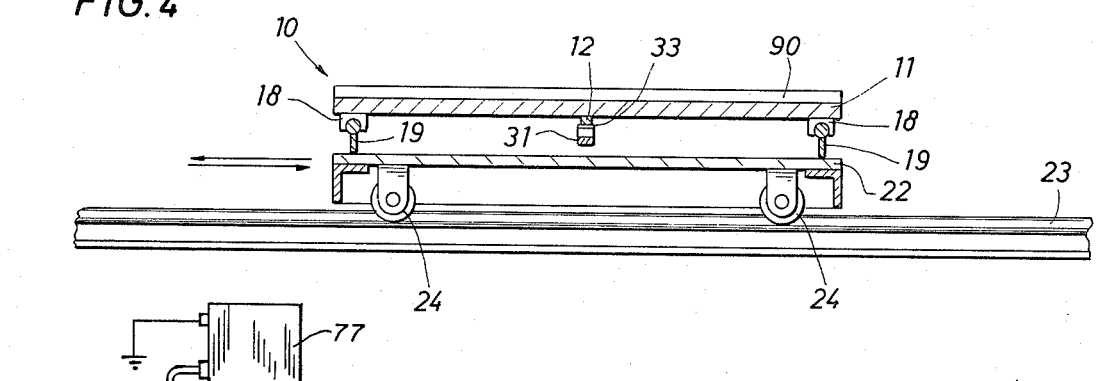
FIG. 4 is a cross-sectional view of Section 4—4 shown in FIG. 3.

Referring now to FIG. 4, there may be seen a cross-sectional view looking along section 4—4 of FIG. 3. Carriage base 22 is depicted supported by support wheels 24 on rail 23. Substrate indexing plate 10 is likewise supported on indexing support tracks 19 for movement above carriage base 22. Base plate 11 is carried above support tracks 19 on slidable mounting 18 which may conveniently take the form of recirculating ball bushings which are slotted to mate with a bar-shaped portion of indexing support track 19. In one embodiment, two recirculating ball bushings are mounted on one side of base plate 11 and are rigidly fixed to base plate 11. A third recirculating ball bushing is mounted on the other side of base plate 11 and is mounted for self-alignment with its mating indexing support track 19. The self-alignment feature compensates for any deviation from precise parallelism between the two indexing support tracks 19.

Figure 5:
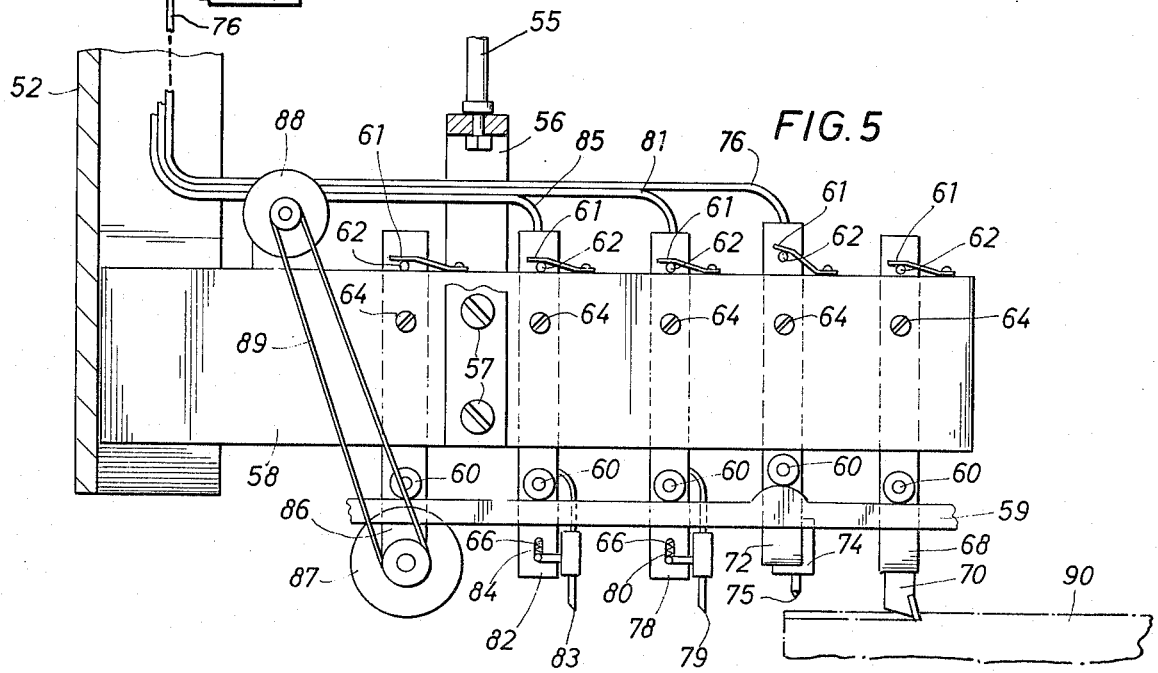
FIG. 5 is an elevation of the tool head assembly.

Referring now to FIG. 5, there is depicted an elevation view of tool head 50 engaging support channel 52. Tool block 58 is provided for housing the various tool components and is affixed to attachment bracket 56 by attachment means which may conveniently take the form of threaded members such as screws or bolts. Attachment bracket 56 is further attached to connecting rod 55 by any acceptable attachment means such as a threaded engagement. Connecting rod 55 is further attached to an operating cylinder 54 (see FIG. 1) which serves to move tool block 58 vertically within channel member 52.

Tool block 58 houses a variety of tool elements, each of which is hereinbelow discussed. Each element may conveniently have a number of features which provide the same functional relationship for each element and these common features will be discussed for a typical tool member. A cam track 59 is provided above the surface of photovoltaic panel 90 and may be conveniently attached to carriage base 22. Cam track 59 engages cam follower 60 on each tool member whereby each tool member is raised against urging means 61 just prior to the tool member engaging the edge of photovoltaic panel 90 and is lowered onto the surface a short distance, typically ⅛ inch or less, after the edge portion passes beneath the tool element. Urging means 61 then maintains vertical stop 62 in engagement with tool block 58 during traverse of the tool element across the surface of photovoltaic panel 90. Urging means 61 may conveniently take the form of a leaf spring which urges vertical stop 62 toward tool block 58 as a cam follower 60 is activated by cam member 59 to cam the tool element over the edge of photovoltaic panel 90.

A further common feature is lateral adjusting means 64, which may conveniently take the form of a threaded member engaging each tool element housing for lateral adjustment of the tool member within tool block 58. As may be seen by reference to FIG. 2, each of the tool elements must maintain a particular and precise lateral alignment with respect to the lead cutting element which forms groove 91 in order to provide the required configuration for the completed cell separation. This is accomplished by adjusting each element by adjustment means 64 to obtain the correct position within tool block 58.

Referring still to FIG. 5 and now to the individual tool elements, there may be seen the leading element which is cutting head assembly 68. Cutting head assembly 68 consists basically of a cutting means 70 which may conveniently take the form of a tungsten carbide-tipped lathe tool bit sharpened to produce a groove about one millimeter wide. Tool bit 70 is urged against the surface of photovoltaic panel 90 by a spring means (not shown) which may be contained internally of cutting head 68. It has been found that a spring force of 4–8 pounds provides sufficient pressure at the tool bit 70 tip to fracture the polycrystalline films whereby defined opposing edges are produced as the tool moves along photovoltaic panel 90.

The polycrystalline layers of cadmium sulfide and cuprous sulfide are relatively easy to remove using the lathe tool bit. The tin oxide layer, conversely, is not penetrated by the tool bit so that the surface of the tin oxide layer is exposed during removal of the overlying semiconductor films. An upper limit on tool bit 70 pressure is produced by the requirement that the tin oxide layer is not removed by the action of tool bit 70.

As an alternative to using a sharpened tool bit for removal of the semiconductor films, a rotating buffer-type wheel might also be used to remove these layers. Acceptable materials for forming such a buffer-type wheel would comprise a soft matrix material impregnated with a hard abrasive material: e.g. material commercially available for forming printed circuit boards having glass fibers in a polymer-type matrix; or a rubber matrix containing grains of abrasive material such as tungsten carbide. Such rotating wheels have an advantage in not requiring sharpening, but have the disadvantage of producing edge configurations in the polycrystalline layers which are less well defined than the edge configurations produced by the sharpened tool bit. Accordingly, the sharpened tool bit is the preferred cutting element.

Following immediately behind cutting head 68 is the conductive layer isolating head 72 which is used to remove a portion of the tin oxide layer to electrically isolate adjacent regions of the tin oxide which forms the electrically conductive base for the overlying semiconductor materials. In one embodiment of the present invention, this is accomplished by vaporizing a portion of the tin oxide layer by means of an electrical arc which apparently acts to vaporize the tin oxide immediately under and adjacent the arc. An electrode 75 is provided by means of a tungsten wire and it has been found that a tungsten wire having about a 40 mil diameter with a point ground to about 2 mil radius removes an acceptable width of tin oxide whereby the adjacent tin oxide areas are electrically isolated. It is desirable to localize the heat generation within the tin oxide layer to the greatest extent possible to minimize any damage to the adjacent semiconductor materials and this is accomplished by optimizing the voltage which is provided to vaporize the tin oxide. It has been found that an applied voltage in the range of about 20–40 volts provides the required results. The minimum voltage is selected to generate sufficient heat to vaporize the tin oxide and is a function of the particular tin oxide film produced on the substrate. The selected voltage must also not cause damage to the adjacent semiconductor materials. Either a.c. or d.c. voltage may be provided, although d.c. is provided in a preferred embodiment.

Conductive layer isolating head 72 is laterally adjusted within tool block 58 to direct electrode tip 75 to an exposed portion of tin oxide near one edge of the furrow produced from cutting tip 70. Electrode tip 75 is urged against the tin oxide surface by a spring means (not shown) which may be conveniently located interiorly of head 72. Only a slight pressure of ¼–½ pound is needed to insure contact between the tip of electrode 75 and the tin oxide surface. Electrode tip 75 is supported by an insulating holder 75 which, in turn, is supported by conductive layer isolating head 72. A power supply cord 76 is attached to electrode tip 75 and interconnects with an external voltage supply 77 which provides the required 20–40 volts of d.c. or a.c. power. It should be noted that a ground connection must be provided between the external power supply 77 and the portion of the tin oxide layer toward which the tool head 50 is being indexed in order to complete the electrical circuit.

Following behind conductive layer isolating head 72 may be either insulation applicator heads 78 and 82, which are substantially identical, or adhesive strip applicator head 86. Insulation applicator heads 78 and 82 carry insulation applicator pens 79 and 83 which move along opposite edges of the furrow created by tool bit 70 and may be urged against the surface of photovoltaic panel 90 by their own weight or by a slight urging force. Applicator pens 79 and 83 are permitted vertical movement along insulation application heads 78 and 82 and are guided in such vertical movement by vertical guide means 80 and 84. Vertical guide means 80 and 84 may conveniently take the form of a groove or slot within applicator heads 78 and 82 which are engaged by guide brackets attached to applicator pens 79 and 83. If needed, urging means 66 may be provided in vertical guide means 80 and 84 to maintain contact between the pen tips and the film surfaces. The lateral positions of applicator pens 79 and 83 within tool block 58 are adjusted by lateral adjustment means 64 to provide the pen tips along the edges of the furrow on the surface of photovoltaic panel 90.

Applicator pens 79 and 83 may be conveniently formed from needles used to provide intravenous injecttions in humans. A standard number 25 sized needle has been found to be satisfactory and the only modification required is to slightly roll back the tip to dull the exit region. Yet another suitable applicator pen is provided under the trade name Leroy which is commercially available at drafting equipment supply stores. The size of each of the applicator pens 79 and 83 is determined by the flow characteristics and viscosity of the particular resins which are being used to form the insulating films.

Insulation film-forming materials are supplied to applicator pens 79 and 83 by supply lines 81 and 82, respectively, from supply cylinders located apart from tool head 50. Generally, a slight pressurization is required to obtain a smooth and continuous flow of the insulation film-forming materials and the supply cylinders are generally pressurized to about 5 p.s.i. A conventional source of compressed air is connected to a regulator which maintains the required pressure which is generally transmitted to the film forming material supply cylinders through a two-way valve whereby the supply cylinders are pressurized only during the traverse of the tool head 50 above the photovoltaic panel 90 in order to prevent any dripping of the film-forming materials during the return traverse of photovoltaic panel 90 beneath the raised tool head 50.

Referring again to FIG. 5, there may be seen an assembly for providing an "adhesive strip" on the tin oxide layer surface, if this is required. Adhesive strip applicator head 86 is shown aft of insulation applicator pens 79 and 83 to obtain a preferred mechanical mounting. However, it may be necessary to mount adhesive strip applicator head 86 forward of applicator pens 79 and 83 to prevent an accumulation of material on the buffer wheel or smearing the insulation. Either arrangement may be used within the scope of the invention. A buffer wheel and pulley assembly 87 is rotatably mounted on adhesive strip applicator head 86 for abrading a selected material onto the tin oxide surface which remains after a portion has been vaporized. The buffer wheel 87 may be brass, zinc or indium, of all which provide an improved contact between the tin oxide layer and an overlying conductor layer. A small drive motor 88 may be mounted on tool block 58, driving buffer wheel and pulley assembly 87 through drive belt 89. It is also possible to mount drive motor 88 on support channel 52 and use a flexible cable to connect with and drive buffer wheel 87.

Thus, it may be appreciated that apparatus is provided to fully prepare a photovoltaic panel for obtaining a plurality of individual photovoltaic cells interconnected into a series array for producing usable quantities of electrical energy. A large scale panel is loaded onto indexing plate 10 and securely clamped into position and indexing means 12 is moved to a first position adjacent tool head 50. Drive means 42 is actuated, pulling traversing carriage 20 along guide track 26 and beneath tool head 50. As each tool element approaches the edge of photovoltaic panel 90 a cam track 59 mounted on traversing carriage 20 lifts the tool element over the edge and onto the surface of photovoltaic panel 90 for bearing against the surface to perform its specific function. A first groove 91 is formed as depicted in FIG. 2 and all of the insulating films and required adhesive strips are applied to groove 91 in a single pass beneath tool head 50. Individual vertical urging means for each tool head permit some variations in panel elevation, i.e. some curvature, as the panel traverses beneath the tool heads. Upon completing the traverse beneath tool head 50, a limit switch is engaged which may reverse movement of traversing carriage 20 and actuate operating cylinder 54 to raise tool head 50 and return traversing carriage 20 for another pass. A second limit switch is actuated upon the return of traversing carriage 20 and drive means 42 is deactivated. Indexing plate 10 is moved to a second position by means of disengaging index pin 33 from one index notch and engaging a second index notch. Drive means 42 is again activated and the above process is repeated until the desired number of photovoltaic cells have been separately formed from photovoltaic panel 90.

Although the above description is directed to apparatus whereby the photovoltaic panel 90 is moved beneath a stationary tool head 50, this is purely a matter of design choice and tool head 50 could equally be made to move and traverse the surface of a stationary photovoltaic panel 90. In that event traversing carriage 20 would be stationary and the tool head 50 and support posts 52 would be mounted on a traversing trolley and interconnected with a drive means. This is contemplated by and is within the scope of the present invention.

It is therefore apparent that the present invention is one well adapted to obtain all of the objects and advantages hereinabove set forth together with other advantages which will become obvious and inherent from a description of the apparatus itself. It will be understood that certain combinations and subcombinations are of utility and may be obtained without reference to other features and subcombinations. This is contemplated by and is within the scope of the present invention.

We claim:

1. Apparatus for operating on a vitreous substrate having a plurality of contiguous component layers of a photovoltaic cell, comprising:
 a base member;
 holding means located on said base member and adapted to define edge positions of said substrate on said base member;
 a head member vertically displaced from said base member;
 positioning means for relatively moving said head member with respect to said base member in a preselected pattern;
 component layer removal means located on said head member and directed toward said base member for forming a track having defined sides while moving in said preselected pattern within said defined edge positions on said base member;

at least one applicator pen located on said head member and aligned substantially along one of said defined sides of said track of said component layer removal means for depositing a strip of insulating material therealong; and an actuating system responsive to the location of said head member relative to said defined edge positions on said base member for selectively actuating said component layer removal means and said at least one applicator pen as said removal means and said pen cross at least one of said defined edge positions.

2. The apparatus described in claim 1, wherein said component layer removal means includes:

a tool bit forming a first track for removing selected portions of an upper one of said component layers, and vaporizing means forming a second track included within said first track for removing selected portions of a lower one of said component layers adjacent said vitreous substrate.

3. The apparatus described in claim 2, further including resilient means for urging said tool bit toward said base member.

4. The apparatus described in claim 2, wherein said vaporizing means includes:

an electrode, power supply means for producing an arc between said electrode and said lower one of said component layers, and resilient means for urging said electrode toward said base member.

5. The apparatus described in claim 2, wherein said at least one applicator pen includes two applicator pens, each aligned along a different side of said first track.

6. The apparatus described in claim 1, 2, 3, 4, or 5, wherein said actuating system includes:

a cam surface located on one of said base member or said removal means and said pen;

a cam follower located on the other one of said base member or said removal means and said pen;

said cam surface and said cam follower being relatively positioned to raise said removal means and said pen adjacent at least one of said defined edge positions and to lower said removal means and said pen after crossing said defined edge position.

7. The apparatus described in claim 2, 3, 4, or 5, further including:

metallic means located on said head member and aligned within said defined sides of said first track and outside said defined sides of said second track for depositing a metallic bonding material on said lower one of said component layers.

8. The apparatus described in claim 7, wherein said actuating system includes:

a cam surface located on one of said base member or said removal means and said pen;

a cam follower located on the other one of said base member or said removal means and said pen;

said cam surface and said cam follower being relatively positioned to raise said removal means and said pen adjacent at least one of said defined edge positions and to lower said removal means and said pen after crossing said defined edge position.

* * * * *